United States Patent
Ma

(10) Patent No.: US 9,941,242 B2
(45) Date of Patent: Apr. 10, 2018

(54) UNPACKED STRUCTURE FOR POWER DEVICE OF RADIO FREQUENCY POWER AMPLIFICATION MODULE AND ASSEMBLY METHOD THEREFOR

(71) Applicant: Innogration (SuZhou) Co., Ltd., Jiangsu (CN)

(72) Inventor: Gordon Chiang Ma, Jiangsu (CN)

(73) Assignee: INNOGRATION (SUZHOU) CO., LTD., Jiangsu (CN)

( * ) Notice: Subject to any disclaimer, the term of this patent is extended or adjusted under 35 U.S.C. 154(b) by 0 days.

(21) Appl. No.: 15/290,256

(22) Filed: Oct. 11, 2016

(65) Prior Publication Data

US 2017/0055341 A1 Feb. 23, 2017

Related U.S. Application Data

(63) Continuation-in-part of application No. 14/395,177, filed as application No. PCT/CN2013/072796 on Mar. 18, 2013, now Pat. No. 9,491,864.

(30) Foreign Application Priority Data

Apr. 24, 2012 (CN) .......................... 2012 1 0122141

(51) Int. Cl.
*H01L 21/00* (2006.01)
*H01L 23/00* (2006.01)
(Continued)

(52) U.S. Cl.
CPC .......... *H01L 24/85* (2013.01); *H01L 21/4871* (2013.01); *H01L 23/053* (2013.01);
(Continued)

(58) Field of Classification Search
CPC .......... H01L 22/00; H05K 1/02; H05K 1/183; H05K 1/021
(Continued)

(56) References Cited

U.S. PATENT DOCUMENTS 5,838,543 A 11/1998 Nakamura
6,018,465 A 1/2000 Borkar
(Continued)

FOREIGN PATENT DOCUMENTS

| CN | 1462088 A | 12/2003 |
|---|---|---|
| CN | 101553918 A | 10/2009 |
| CN | 102623416 A | 8/2012 |
| CN | 202633264 U | 12/2012 |
| TW | 200411850 | 7/2004 |

OTHER PUBLICATIONS

International Search Report issued in PCT/CN2013/072796 dated Jun. 20, 2013 (3 pages).

*Primary Examiner* — Dion R Ferguson
*Assistant Examiner* — Mandeep S Buttar
(74) *Attorney, Agent, or Firm* — RatnerPrestia

(57) ABSTRACT

A power device without a package structure in a radio frequency power amplifier module and an assembly method for a radio frequency power amplifier module are provided. The radio frequency power amplification module includes the power device, a heat dissipating plate and a printed circuit board. The power device includes a carrier flange, a plurality of electronic elements and bond-wires, and the electronic elements are adhered to the carrier flange, the power device and the printed circuit board are fixed on the heat dissipating plate, the electronic elements of the power device are connected with each other through the bond-wires, and the electronic elements are directly connected to the printed circuit board through the bond-wires. The electronic elements include at least one passive device, a decoupling capacitor is disposed on the printed circuit board, and the decoupling capacitor is connected to the passive device through the bond-wires.

18 Claims, 6 Drawing Sheets

(51) Int. Cl.
    *H03F 3/195* (2006.01)
    *H05K 1/18* (2006.01)
    *H05K 1/02* (2006.01)
    *H01L 23/053* (2006.01)
    *H01L 23/367* (2006.01)
    *H01L 23/552* (2006.01)
    *H01L 23/66* (2006.01)
    *H01L 21/48* (2006.01)

(52) U.S. Cl.
    CPC ........ *H01L 23/3675* (2013.01); *H01L 23/552* (2013.01); *H01L 23/66* (2013.01); *H01L 24/49* (2013.01); *H03F 3/195* (2013.01); *H05K 1/021* (2013.01); *H05K 1/183* (2013.01); *H01L 24/48* (2013.01); *H01L 2223/6611* (2013.01); *H01L 2223/6644* (2013.01); *H01L 2224/48091* (2013.01); *H01L 2224/48137* (2013.01); *H01L 2224/48195* (2013.01); *H01L 2224/49175* (2013.01); *H01L 2224/85801* (2013.01); *H01L 2924/00014* (2013.01); *H01L 2924/16152* (2013.01); *H01L 2924/19041* (2013.01); *H01L 2924/19042* (2013.01); *H01L 2924/19043* (2013.01); *H01L 2924/3025* (2013.01); *H05K 2201/10015* (2013.01); *H05K 2201/10166* (2013.01); *H05K 2203/049* (2013.01)

(58) Field of Classification Search
    USPC ........ 361/820, 715; 174/52.4; 257/710, 725, 257/E21.505, 712; 330/67, 66, 151, 180, 330/178, 307
    See application file for complete search history.

(56) References Cited

U.S. PATENT DOCUMENTS

| | | | |
|---|---|---|---|
| 6,137,688 | A | 10/2000 | Borkar |
| 6,333,522 | B1 | 12/2001 | Inoue |
| 6,775,145 | B1 | 8/2004 | Chen |
| 6,853,559 | B2 | 2/2005 | Panella |
| 7,119,613 | B2 * | 10/2006 | Bakker ............... H01L 23/66 330/302 |
| 7,446,411 | B2 | 11/2008 | Condie |
| 7,583,506 | B1 | 9/2009 | Huang |
| 9,721,902 | B2 * | 8/2017 | Jiang ............... H01L 23/552 |
| 2001/0026438 | A1 | 10/2001 | Ploix |
| 2002/0131237 | A1 | 9/2002 | Snyder |
| 2003/0024633 | A1 | 2/2003 | Ogura |
| 2003/0034557 | A1 | 2/2003 | Gupta |
| 2003/0060172 | A1 | 3/2003 | Kuriyama |
| 2003/0076174 | A1 | 4/2003 | Tanoue |
| 2003/0117220 | A1 | 6/2003 | Kuriyama |
| 2003/0137809 | A1 | 7/2003 | Inoue |
| 2004/0150099 | A1 | 8/2004 | Ding |
| 2004/0222848 | A1 | 11/2004 | Osakada |
| 2005/0093013 | A1 | 5/2005 | Mastromatteo |
| 2005/0199999 | A1 | 9/2005 | Shirasawa |
| 2008/0136559 | A1 | 6/2008 | Takahashi |
| 2008/0142935 | A1 | 6/2008 | Montoriol |
| 2008/0205008 | A1 | 8/2008 | Sun |
| 2008/0266803 | A1 | 10/2008 | Golhardt |
| 2008/0310120 | A1 | 12/2008 | Wallrafen |
| 2009/0315701 | A1 | 12/2009 | Anderson |
| 2011/0096495 | A1 | 4/2011 | Heise |
| 2012/0014059 | A1 | 1/2012 | Zeng |
| 2012/0300402 | A1 | 11/2012 | Vos |

* cited by examiner

UNPACKED STRUCTURE FOR POWER DEVICE OF RADIO FREQUENCY POWER AMPLIFICATION MODULE AND ASSEMBLY METHOD THEREFOR

This application is a continuation-in-part of U.S. application Ser. No. 14/395,177, filed on Oct. 17, 2014, which is a National Stage application of International Application No. PCT/CN2013/072796, filed on Mar. 18, 2013. The International Application claims priority to Chinese Patent Application No. 201210122141.1, filed on Apr. 24, 2012. All of the aforementioned applications are hereby incorporated by reference in their entireties.

FIELD

The disclosure relates to a design of a radio frequency power amplifier in wireless communication field, in particular to a power device without a package structure in a radio frequency power amplifier module and an assembly method thereof.

BACKGROUND

At present, in wireless communication field, a structure of a mainstream high-power radio frequency power amplifier module is shown in FIG. 1, which includes a packaged power device, a printed circuit board, and a heat dissipating plate disposed below the packaged power device and the printed circuit board. The packaged power device includes a ceramic package. When a user uses the packaged power device, the package device shields an inner part thereof from the user. Thus, the user may not modify a pre-matching configuration inside packaged power device, and performance of the device is principally limited by a design of manufacturers of the device. In addition, as shown in FIG. 2, the conventional packaged power device has an input and output pin. When a user uses the packaged power device, electronic elements of the packaged power device are connected to the input and output pin through bond-wires, and then the input and output pin is fixedly welded on the printed circuit board. In this way, the power device is electrically connected to the printed circuit board. Therefore, a width of a conductive portion of the printed circuit board may not be narrower than a width of the packaged device, which contradicts a current trend of device miniaturization. Furthermore, the package of the packaged device inevitably causes parasitic capacitance, the input and output pin has an inductance, and the process of welding the input and output pin to the printed circuit board may cause a large error, all of which may directly affect a matching circuit of the device, and thus affect performance indicators of the device.

In wireless communication systems, more bandwidth is demanded in order to accommodate more uses and faster data rates. The bandwidth may be limited by two factors, i.e., RF bandwidth and video (low frequency) bandwidth (VBW). The VBW is the primary limitation for the ability of modern digital pre-distortion systems. In the conventional technology, a decoupling LC circuit 15 is arranged in the package of the packaged power device, to improve data rate and VBW in a wireless communication system, as shown in FIG. 3. Since the decoupling LC circuit 15 is arranged in the cavity of the packaged power device, the size and component value of the decoupling LC circuit 15 are limited. Thus, it is difficult to maximize VBW due to the limited size of the decoupling LC circuit 15.

SUMMARY

The disclosure is to provide a power device without a package structure in a radio frequency power amplifier module and an assembly method thereof. With the disclosure, problems caused by packaged devices are avoided, flexibility is greatly improved when the user uses the device, and cost is saved a lot. In addition, design freedom and performance may be improved, and user requirement for customized design may be met.

To solve the problems in conventional technology, technical solutions are provided according to the disclosure as follows.

A power device without a package structure in a radio frequency power amplifier module is provided according to an embodiment. The radio frequency power amplifier module includes the power device, a heat dissipating plate and a printed circuit board. The printed circuit board has an opening and the printed circuit board with the opening is fixed on the heat dissipating plate. The power device includes a carrier flange, a plurality of electronic elements and bond-wires, the electronic elements are adhered to the carrier flange, and the carrier flange adhered with the electronic elements is embedded into the opening of the printed circuit board and fixed on the heat dissipating plate. The electronic elements of the power device are connected with each other through the bond-wires, the electronic elements are directly connected to the printed circuit board through the bond-wires, and the electronic elements include at least one passive device. A decoupling capacitor is disposed on the printed circuit board, and the decoupling capacitor is connected to the passive device through the bond-wires to form a decouple circuit.

Preferably, the electronic elements further include a die, the passive device is a capacitor, the die and the capacitor are directly welded on the carrier flange, the carrier flange is welded on the heat dissipating plate and the die and the capacitor are directly connected to the printed circuit board through the bond-wires.

Preferably, the passive device is an L-shaped passive device, and the L-shaped passive device has a long side and a short side.

Preferably, the decoupling capacitor is connected to the short side of the L-shaped passive device via the bond-wires.

Preferably, the passive device is a rectangular passive device, the rectangular passive device has a long side and a short side, and the decoupling capacitor is connected to the short side of the rectangular passive device via the bond-wires.

Preferably, a capacitance of the decoupling capacitor is larger than 1 µF, and an inductance of the bond-wire disposed between the decoupling capacitor and the passive device is smaller than 0.2 nH.

Preferably, a resistor is disposed on the printed circuit board, and the passive device is connected to the decoupling capacitor through the resistor.

Preferably, the resistance of the resistor is smaller than 1 Ohm.

Preferably, top surfaces of the electronic elements of the power device are flush with a top surface of the printed circuit board.

Preferably, a protective cover is disposed outside the power device, the bond-wires and the decoupling LC circuit; the protective cover is fixed on the printed circuit board; and the protective cover completely covers the power device, the bond-wires and the decoupling LC circuit to form a seal cavity, and is adapted to protect the power device, the bond-wires and the decoupling LC circuit.

In another aspect, an assembly method for a radio frequency power amplifier module is provided, which includes:

preparing a printed circuit board and forming an opening in the printed circuit board;

fixing the printed circuit board with the opening on a heat dissipating plate;

welding a plurality of electronic elements on a carrier flange, wherein a size of the carrier flange is smaller than a size of the opening and the electronic elements include at least one passive device;

locating the carrier flange in the opening, and fixing the carrier flange to the heat dissipating plate;

bonding wires between the electronic elements and the printed circuit board, to connect the electronic elements to the printed circuit board through bond-wires directly, wherein a decoupling capacitor is disposed on the printed circuit board, and the bonding wires between the electronic elements and the printed circuit board includes:

bonding wires between the passive device and the decoupling capacitor to form a decouple circuit.

Preferably, the electronic elements further include a die, the passive device is a capacitor, the die and the capacitor are directly welded on the carrier flange, the carrier flange is welded on the heat dissipating plate and the die and the capacitor are directly connected to the printed circuit board through the bond-wires.

Preferably, the passive device is an L-shaped passive device, and the L-shaped passive device has a long side and a short side.

Preferably, the bonding wires between the passive device and the decoupling capacitor includes:

bonding the wires between the decoupling capacitor and the short side of the L-shaped passive device via the bond-wires.

the passive device is a rectangular passive device, and the bonding wires between the passive device and the decoupling capacitor includes:

bonding the wires between the decoupling capacitor and the short side of the rectangular passive device via the bond-wires Preferably, a resistor is disposed on the printed circuit board, and the bonding wires between the passive device and the decoupling capacitor includes:

bonding the wires between the passive device and the decoupling capacitor via the resistor.

Preferably, top surfaces of the electronic elements of the power device are flush with a top surface of the printed circuit board.

Preferably, a protective cover is disposed outside the power device, the bond-wires and the decoupling LC circuit, the protective cover is fixed on the printed circuit board and completely covers the power device, the bond-wires and the decoupling LC circuit to form a closed cavity, and a sealant is applied on an edge, connected with the printed circuit board, of the protective cover.

Compared with the solutions in conventional technology, the disclosure is advantageous as follows.

Compared with a conventional packaged power device, the power device according to the disclosure does not have a ceramic package, and an input and output pin. In the disclosure, elements of the power device may be directly connected to a printed circuit board through bond-wires. In the disclosure, the user may perform an operation on the power device, and thus design freedom is improved. In addition, since the power device does not have the input and output pin, solder and a ceramic frame disposed between the input and output pins, undesirable inductance introduction is avoided, a horizontal distance between the die and the printed circuit board is shortened, the inductance of the bond-wire is reduced, the package parasitic capacitance is reduced, the accuracy of integrating the power device and the printed circuit board is increased, and the performance of the radio frequency power amplifier module is improved.

BRIEF DESCRIPTION OF THE DRAWINGS

The disclosure is further described in the following in conjunction with drawings and embodiments.

In FIGS. 1 to 11, 1, power device; 2, printed circuit board; 3, heat dissipating plate; 4, input and output pin; 5, carrier flange; 6, die; 7, bond-wires; 8, capacitor; 9, package casing; 10, electromagnetic interference shielding; 11, protective cover; 12 drive die; 13, integrated passive device; 14, integrated passive device; 15 decoupling LC circuit; 16 decoupling capacitor; 17 resistor.

DETAILED DESCRIPTION OF EMBODIMENTS

Foregoing solutions are further described in the following in conjunction with embodiments. It is should be understood that the embodiments are adapted to describe the disclosure and is not limited to the scope of the disclosure. Used implementation condition according to the embodiments may be further adjusted according to condition of specific manufacturers, and unspecified implementation condition usually is condition for normal experiments.

Embodiment

Figure 1:
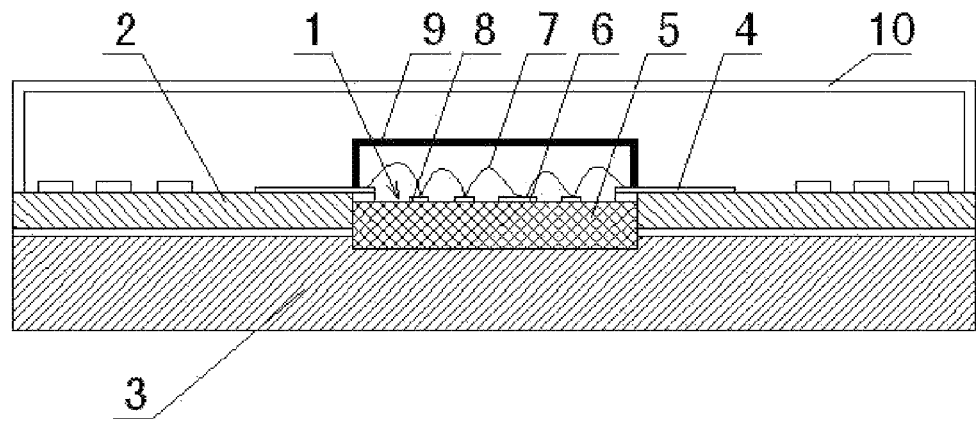
FIG. 1 is a schematic structural diagram of a conventional radio frequency power amplifier module.
Figure 2:
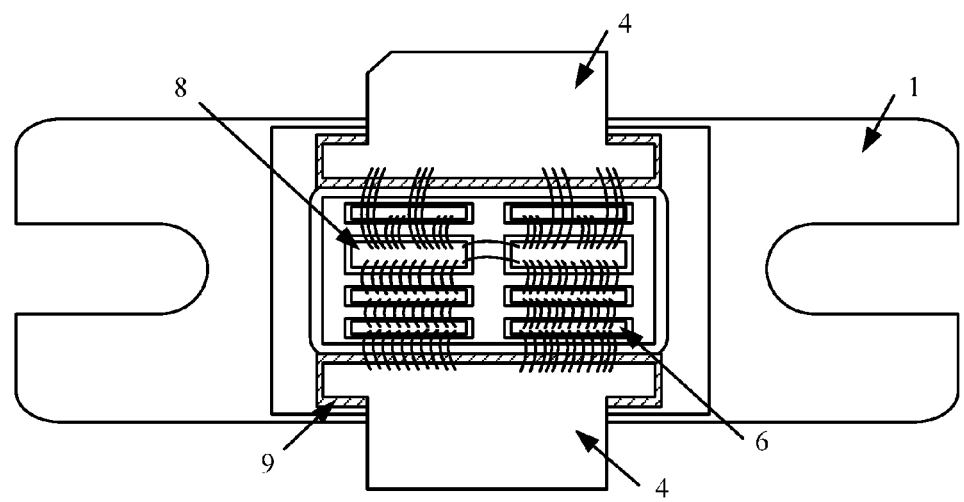
FIG. 2 is a schematic diagram of wire bonding of a packaged power device in a conventional radio frequency power amplifier module.
Figure 3:
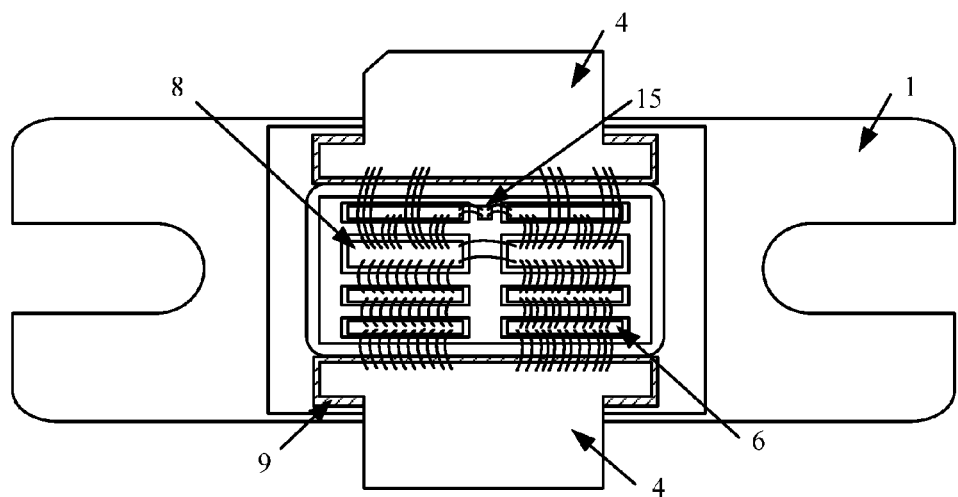
FIG. 3 is a schematic diagram of wire bonding of a packaged power device with a decoupling LC circuit in a conventional radio frequency power amplifier module.
Figure 4:
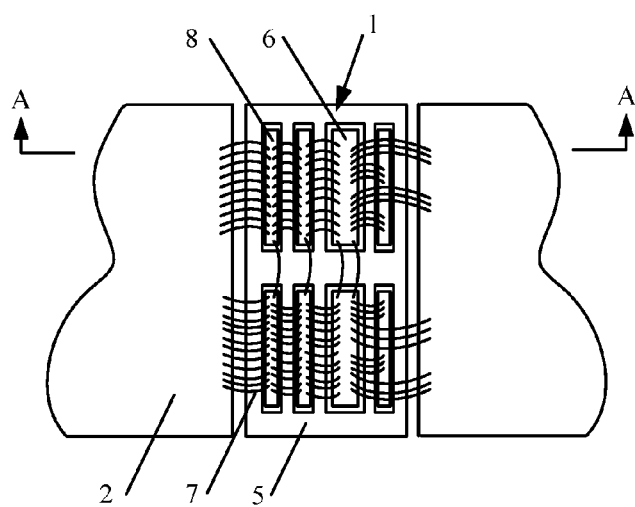
FIG. 4 is a schematic diagram of wire bonding of a power device in a radio frequency power amplifier module according to an embodiment of the disclosure.
Figure 5:
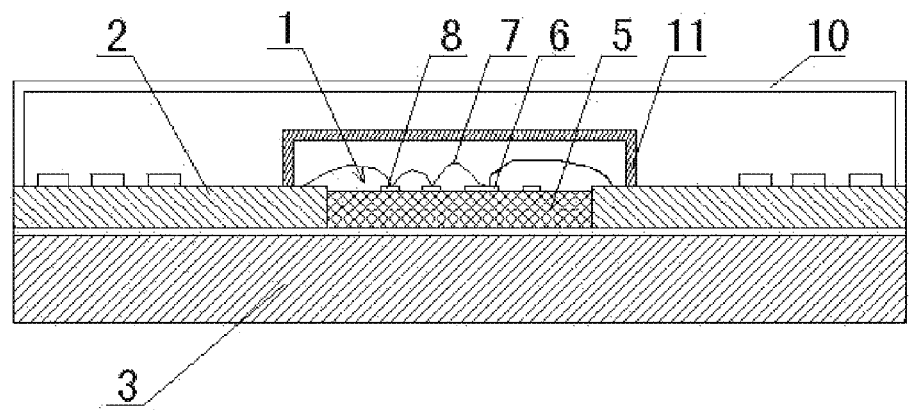
FIG. 5 is a sectional diagram taking along A-A of FIG. 4.

FIG. 4 is a schematic diagram of wire bonding of a power device in a radio frequency power amplifier module according to an embodiment of the disclosure. FIG. 5 is a sectional diagram taking along A-A of FIG. 4, which shows a power device without a package structure in a radio frequency power amplifier module according to the embodiment. The radio frequency power amplifier module includes a power device 1, a heat dissipating plate 3, a printed circuit board 2 and an electromagnetic interference shielding 10. The power device 1 is embedded into the printed circuit board 2. The heat dissipating plate 3 is disposed below the power device 1 and the printed circuit board 2. The power device 1 includes a carrier flange 5, multiple electronic elements and bond-wires 7. The electronic elements are adhered to the carrier flange 5 according to a design requirement. The power device 1 and the printed circuit board 2 are fixedly welded on the heat dissipating plate 3. The electronic elements of the power device 1 are connected with each other through the bond-wires 7. The die 6 and at least one capacitor 8 are directly connected to the printed circuit board 2 through the bond-wires 7. The electromagnetic interference shielding 10 completely covers the printed circuit board 2, and is adapted to protect internal components of the printed circuit board 2 and the power device 1 disposed on the printed circuit board 2.

The electronic elements of the power device 1 include a die 6 and the capacitor 8. The capacitor 8 may be a metal oxide semiconductor (MOS) capacitor or metal insulator metal (MIM) capacitor. The die 6 and the capacitor 8 are welded to the carrier flange 5 through a wafer welding device, and then the carrier flange 5 is welded on the heat dissipating plate 3. Top surfaces of the electronic elements are flush with a top surface of the printed circuit board 2. The die 6 and the capacitor 8 of the power device 1 are directly connected to the printed circuit board 2 through the bond-wires 7.

A protective cover 11 is disposed outside the power device. The protective cover 11 is fixed on the printed circuit board 2, which completely covers the power device 1 to form a seal cavity, and is adapted to protect the power device 1 and prevent impurities entering into the power device 1. The protective cover 11 is fixedly connected to the printed circuit board 2 through a clamping slot. In this way, the protective cover may be assembled and disassembled conveniently, thereby facilitating later debugging and examination for the power device 1.

A sealant is applied on an edge, connected with the printed circuit board 2, of the protective cover 11. A sealing protective effect of the protective cover 11 may be better by filling a joint gap between the protective cover 11 and the printed circuit board 2 with the sealant.

Figure 8:
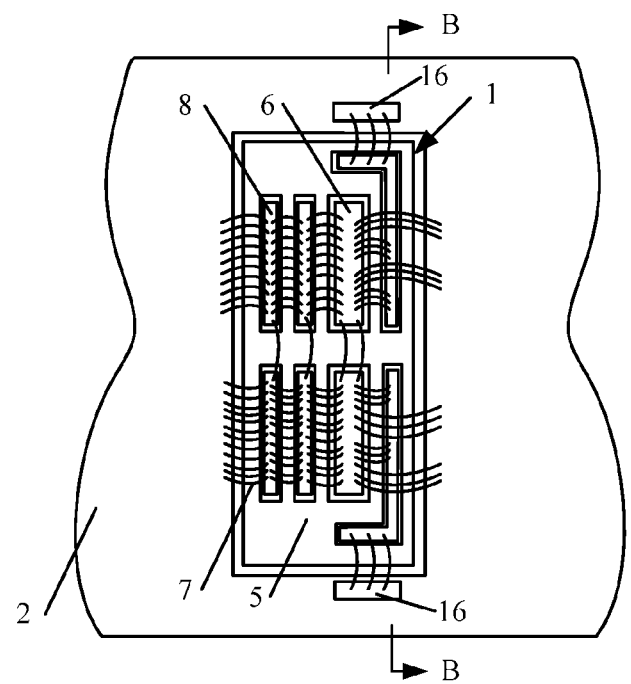
FIG. 8 is a schematic diagram of wire bonding of a power device in a radio frequency power amplifier module according to another embodiment of the disclosure.
Figure 9:
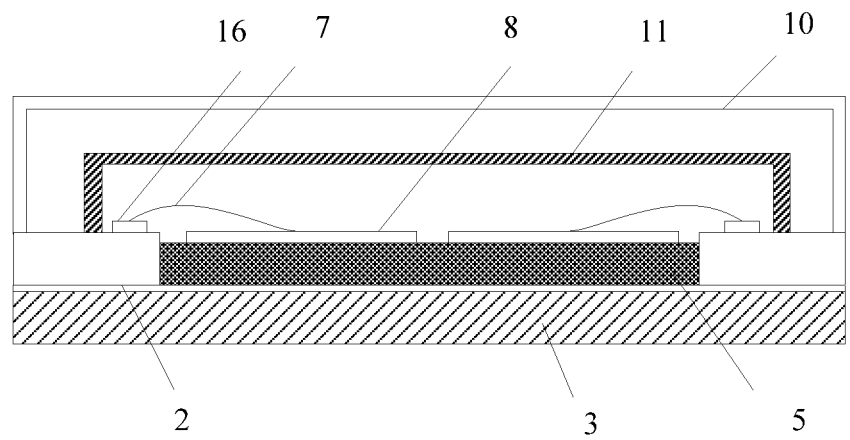
FIG. 9 is a sectional diagram taking along B-B of FIG. 4.

FIG. 8 is a schematic diagram of wire bonding of a power device in a radio frequency power amplifier module according to another embodiment of the disclosure. FIG. 9 is a sectional diagram taking along B-B of FIG. 4. In this embodiment, a power device 1 without a package structure in a radio frequency power amplifier module is provided. The radio frequency power amplifier module includes the power device 1, a heat dissipating plate 3 and a printed circuit board 2. The printed circuit board 2 has an opening and the printed circuit board 2 with the opening is fixed on the heat dissipating plate 3. The power device 1 includes a carrier flange 5, multiple electronic elements and bond-wires 7, the electronic elements are adhered to the carrier flange 5, and the carrier flange 5 adhered with the electronic elements is embedded into the opening of the printed circuit board 2 and fixed on the heat dissipating plate 3. The electronic elements of the power device 1 are connected with each other through the bond-wires 7. The electronic elements are directly connected to the printed circuit board 2 through the bond-wires 7. The electronic elements include at least one passive device. A decoupling capacitor 16 is disposed on the printed circuit board 2, and the decoupling capacitor 16 is connected to the passive device through the bond-wires 7 to form a decouple circuit.

The passive device is a capacitor 8 or an integrated passive device 14.

The electronic elements further include a die 6. The die 6 and the passive device are directly welded on the carrier flange 5, and the die 6 and the passive device are directly connected to the printed circuit board 2 through the bond-wires 7.

In the embodiment, the capacitor, the decoupling capacitor and the bond-wires therebetween are formed a decoupling LC circuit. The bond-wires between the capacitor and the decoupling capacitor are used as an inductor of the decoupling LC circuit. In stead of the decoupling LC circuit 15 arranged in the package of the packaged power device in the prior art, the decoupling capacitor 16 according to the embodiment is disposed on the printed circuit board 2, and thus the size of the decoupling capacitor 16 is not limited by the package of the packaged power device.

In addition, a small inductance of the inductor and a large capacitance of the decoupling capacitor may improve the VBW. The decoupling capacitor disposed on the printed circuit board may have a large capacitance. The larger the capacitance, the larger the size of the capacitor. Thus, the decoupling capacitor in the embodiment may have a large capacitance. In an embodiment, the capacitance of the decoupling capacitor may be larger than 1 µF, and an inductance of the bond-wire disposed between the decoupling capacitor and the passive device is smaller than 0.2 nH.

In an embodiment, a protective cover 11 is disposed outside the power device 1, the bond-wires 7 and the decoupling LC circuit. The protective cover 11 is fixed on the printed circuit board 2, which completely covers the power device 1, the bond-wires 7 and the decoupling LC circuit to form a seal cavity, so as to protect the power device, the bond-wires and the decoupling LC circuit. The protective cover 11 is fixedly connected to the printed circuit board 2 through a clamping slot. In this way, the protective cover may be assembled and disassembled conveniently, thereby facilitating later debugging and examination for the power device 1.

A sealant is applied on an edge, connected with the printed circuit board 2, of the protective cover 11. A sealing protective effect of the protective cover 11 may be better by filling a joint gap between the protective cover 11 and the printed circuit board 2 with the sealant.

In the embodiment, referring to FIG. 8 the passive device is an L-shaped passive device, and the L-shaped passive device has a long side and a short side. The decoupling capacitor is connected to the short side of the L-shaped passive device via the bond-wires as shown in FIG. 8.

Figure 10:
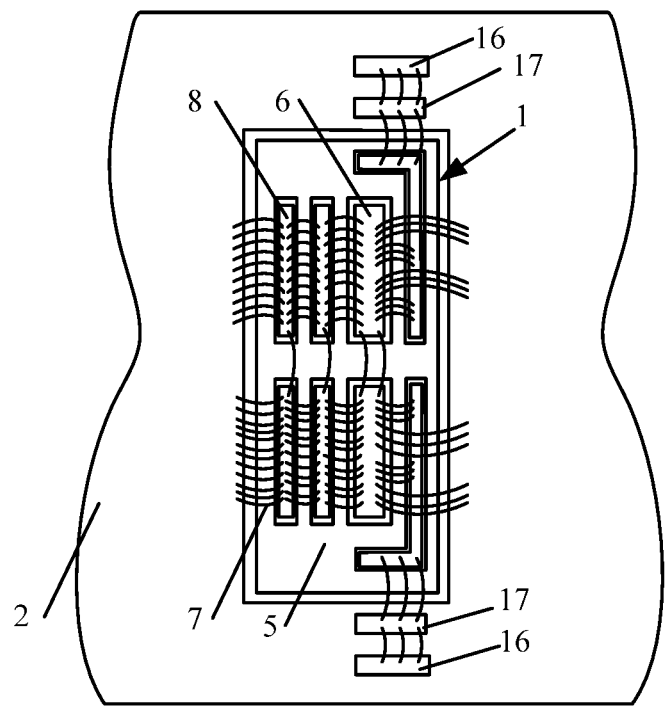
FIG. 10 is a schematic diagram of wire bonding of a power device in a radio frequency power amplifier module according to another embodiment of the disclosure.

FIG. 10 is a schematic diagram of wire bonding of a power device in a radio frequency power amplifier module according to another embodiment of the disclosure. In a preferred embodiment, a resistor 17 is disposed on the printed circuit board 2, and the passive device is connected to the decoupling capacitor 16 through the resistor 17. The decoupling capacitor is connected to the resistor 17 via bond-wires, and the resistor 17 is connected to the passive device via bond-wires. In an embodiment, the resistance of the resistor is smaller than 1 Ohm. The stability of the radio frequency power amplifier module may be improved by providing the resistor 17.

Figure 11:
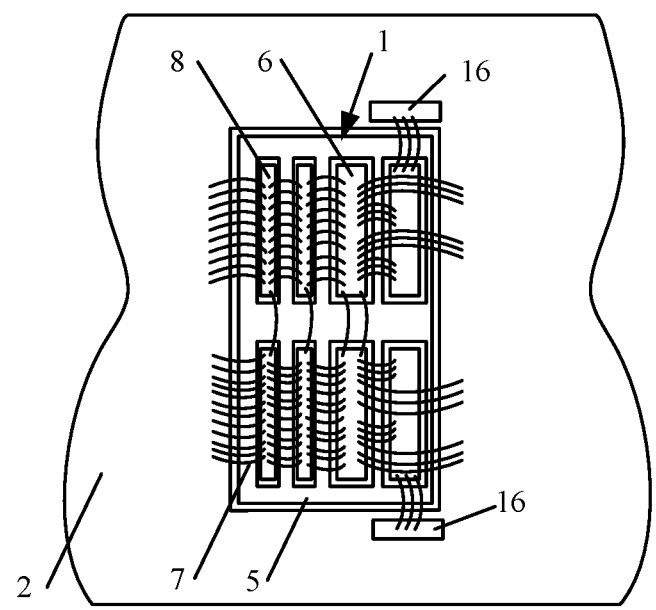
FIG. 11 is a schematic diagram of wire bonding of a power device in a radio frequency power amplifier module according to another embodiment of the disclosure.

FIG. 11 is a schematic diagram of wire bonding of a power device in a radio frequency power amplifier module according to another embodiment of the disclosure. In the embodiment, the passive device is a rectangular passive device, the rectangular passive device has a long side and a short side, and the decoupling capacitor is connected to the short side of the rectangular passive device via the bond-wires.

An assembly method of a radio frequency power amplifier module without a package structure is also provided according to the embodiment of the disclosure. Based on the power device without a package structure in the radio frequency power amplifier module described above, the assembly method specifically includes following assembly steps:

first, selecting a material and a size of a carrier flange according to design requirement, and welding a die 6 and a capacitor 8 on the carrier flange 5 through a device;

second, welding the carrier flange 5 adhered with the die 6 and the capacitor 8 on a heat dissipating plate 3, locating the printed circuit board 2 at a position corresponding to the carrier flange 5 (forming an open on the printed circuit board 2, where the opening is matched to a shape and a position of the carrier flange 5), and welding a printed circuit board 2 on the heat dissipating plate 3;

last, bonding, by a wire bonder, wires between the electronic elements and a matching circuit according to the design requirement, and connecting the die 6 and the capacitor 8 connected to the printed circuit board 2 through the bond-wires 7 directly.

Compared with a conventional packaged power device, a power device 1 according to the embodiment does not have a ceramic package, and an input and output pin 4. In the disclosure, elements of the power device 1 may be directly connected to the printed circuit board 2 through the bond-wires 7. In the disclosure, the user may perform an operation on the power device 1; and thus the power device 1 may be fine tuned based on a subsequent test after assembly. In the conventional packaged power device, a package casing 9 is adapted to cover the power device. The package casing 9 is fixed on the input and output pin 4 in a box shape, which can not be freely opened. Based on above features, design freedom is improved according to the disclosure. In addition, the power device 1 according to the disclosure does not have the input and output pin 4, thereby avoiding introduction of undesirable inductance and capacitance, and improving performance of the radio frequency power amplifier module.

Figure 6:
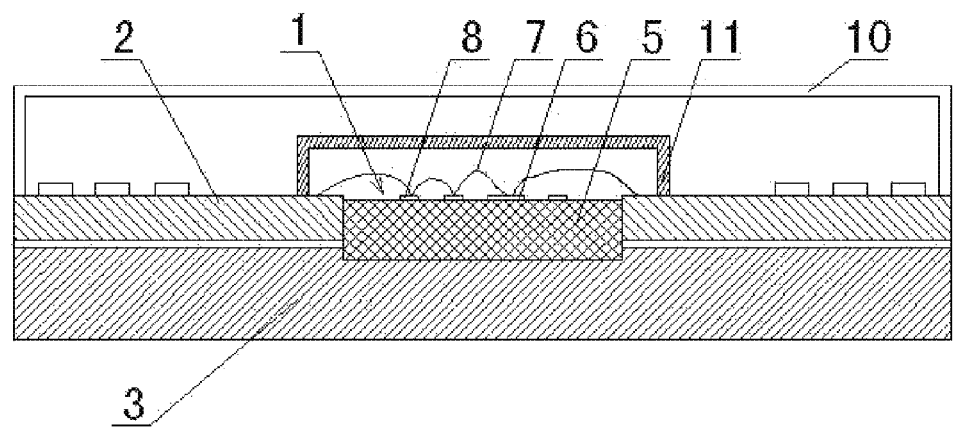
FIG. 6 is another sectional diagram taking along A-A of FIG. 4.

In a case that the carrier flange 5 of the power device 1 has a thickness of relative thick, the carrier flange 5 is disposed as shown in FIG. 6. A designer may provide an accommodating cavity, which matches the carrier flange 5, on the heat dissipating plate 3. The carrier flange 5 is fixedly welded in the accommodating cavity to make the top surfaces of the electronic elements of the carrier flange 5 be flush with the top surface of the printed circuit board 2. Other parts of the device may be disposed and connected in the same way as the foregoing embodiment.

Figure 7:
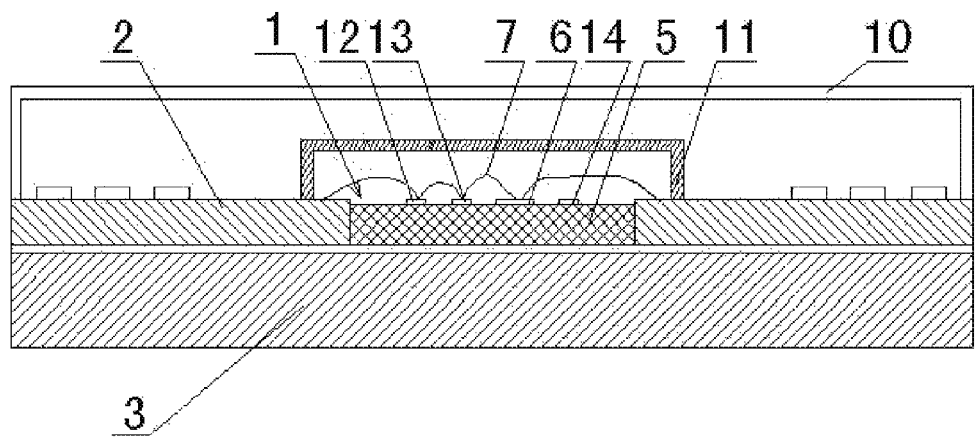
FIG. 7 is another sectional diagram taking along A-A of FIG. 4.

FIG. 7 shows a structure of a power amplifier module, which is another embodiment for the assembly method according to the disclosure. As shown in FIG. 6, electronic elements of a power device 1 include a die 6, a capacitor 8, a drive die 12, an integrated passive device 13 and an integrated passive device 14, where the die 6 is used as an output die. In the same way, the electronic elements are welded on the carrier flange 5 through a wafer welding device, and then the carrier flange 5 is welded on the heat dissipating plate 3. The top surfaces of the electronic elements of the power device 1 are flush with the top surface of the printed circuit board 2. The electronic elements are all directly connected with each other through bond-wires 7, and the electronic elements are directly connected to the printed circuit board through the bond-wires 7.

An assembly method for a radio frequency power amplifier module is provided according an embodiment. The assembly method includes:

preparing a printed circuit board 2 and forming an opening in the printed circuit board 2;

fixing the printed circuit board 2 with the opening on a heat dissipating plate 3;

welding multiple electronic elements on a carrier flange 5, wherein a size of the carrier flange 5 is smaller than a size of the opening and the electronic elements include at least one passive device;

locating the carrier flange 5 in the opening, and fixing the carrier flange 5 to the heat dissipating plate 3;

bonding wires between the electronic elements and the printed circuit board 2, to connect the electronic elements to the printed circuit board 2 through bond-wires 7 directly.

A decoupling capacitor 16 is disposed on the printed circuit board 2.

The step of bonding wires between the electronic elements and the printed circuit board 2 includes: bonding wires between the passive device and the decoupling capacitor to form a decouple circuit.

With the assembly method according to the embodiment, the capacitor, the decoupling capacitor and the bond-wires therebetween are formed a decoupling LC circuit. The bond-wires between the capacitor and the decoupling capacitor are used as an inductor of the decoupling LC circuit. In stead of the decoupling LC circuit 15 arranged in the package of the packaged power device in the prior art, the decoupling capacitor 16 according to the embodiment is disposed on the printed circuit board 2, and thus the size of the decoupling capacitor 16 is not limited by the package of the packaged power device.

In addition, a small inductance of the inductor and a large capacitance of the decoupling capacitor may improve the VBW. The decoupling capacitor disposed on the printed circuit board may have a large capacitance. The larger the capacitance, the larger the size of the capacitor. Thus, the decoupling capacitor in the embodiment may have a large capacitance. In an embodiment, the capacitance of the decoupling capacitor may be larger than 1 μF, and an inductance of the bond-wire disposed between the decoupling capacitor and the passive device is smaller than 0.2 nH.

In an embodiment, a protective cover 11 is disposed outside the power device 1, the bond-wires 7 and the decoupling LC circuit. The protective cover 11 is fixed on the printed circuit board 2, which completely covers the power device 1, the bond-wires 7 and the decoupling LC circuit to form a seal cavity, so as to protect the power device, the bond-wires and the decoupling LC circuit. The protective cover 11 is fixedly connected to the printed circuit board 2 through a clamping slot. In this way, the protective cover may be assembled and disassembled conveniently, thereby facilitating later debugging and examination for the power device 1.

A sealant is applied on an edge, connected with the printed circuit board 2, of the protective cover 11. A sealing protective effect of the protective cover 11 may be better by filling a joint gap between the protective cover 11 and the printed circuit board 2 with the sealant.

The foregoing embodiments are only to describe technical ideas and features. Those skilled in the art may understand content of the disclosure and perform implementation based on the above embodiments. The embodiments are not meant to limit the scope of the disclosure. All equivalent alternations or modifications made according to the spirit of the disclosure should fall within the scope of the disclosure.

The invention claimed is:

1. A power device without a package structure in a radio frequency power amplifier module, wherein the radio frequency power amplifier module comprises the power device, a heat dissipating plate and a printed circuit board,
wherein the printed circuit board has an opening and the printed circuit board with the opening is fixed on the heat dissipating plate,
the power device comprises a carrier flange, a plurality of electronic elements and bond-wires, the electronic elements are adhered to the carrier flange, and the carrier flange adhered with the electronic elements is embedded into the opening of the printed circuit board and fixed on the heat dissipating plate,
the electronic elements of the power device are connected with each other through the bond-wires, the electronic elements are directly connected to the printed circuit board through the bond-wires, and the electronic elements comprise at least one passive device; and
a decoupling capacitor is disposed on the printed circuit board, and the decoupling capacitor is connected to the passive device through the bond-wires to form a decouple circuit.

2. The power device without a package structure in a radio frequency power amplifier module according to claim 1, wherein the electronic elements further comprise a die, and the passive device is a capacitor, the die and the capacitor are directly welded on the carrier flange, the carrier flange is welded on the heat dissipating plate, and the die and the capacitor are directly connected to the printed circuit board through the bond-wires.

3. The power device without a package structure in a radio frequency power amplifier module according to claim 1, wherein the passive device is an L-shaped passive device, and the L-shaped passive device has a long side and a short side.

4. The power device without a package structure in a radio frequency power amplifier module according to claim 3, wherein the decoupling capacitor is connected to the short side of the L-shaped passive device via the bond-wires.

5. The power device without a package structure in a radio frequency power amplifier module according to claim 1, wherein the passive device is a rectangular passive device, the rectangular passive device has a long side and a short side, and the decoupling capacitor is connected to the short side of the rectangular passive device via the bond-wires.

6. The power device without a package structure in a radio frequency power amplifier module according to claim 1, wherein a capacitance of the decoupling capacitor is larger than 1 µF, and an inductance of the bond-wires disposed between the decoupling capacitor and the passive device is smaller than 0.2 nH.

7. The power device without a package structure in a radio frequency power amplifier module according to claim 1, wherein a resistor is disposed on the printed circuit board, and the passive device is connected to the decoupling capacitor through the resistor.

8. The power device without a package structure in a radio frequency power amplifier module according to claim 7, wherein the resistance of the resistor is smaller than 1 Ohm.

9. The power device without a package structure in a radio frequency power amplifier module according to claim 1, wherein top surfaces of the electronic elements of the power device are flush with a top surface of the printed circuit board.

10. The power device without a package structure in a radio frequency power amplifier module according to claim 1, wherein a protective cover is disposed outside the power device, the bond-wires and the decoupling LC circuit; the protective cover is fixed on the printed circuit board; and the protective cover completely covers the power device, the bond-wires and the decoupling LC circuit to form a seal cavity, and is adapted to protect the power device, the bond-wires and the decoupling LC circuit.

11. An assembly method for a radio frequency power amplifier module, comprising:
preparing a printed circuit board and forming an opening in the printed circuit board;
fixing the printed circuit board with the opening on a heat dissipating plate;
welding a plurality of electronic elements on a carrier flange, wherein a size of the carrier flange is smaller than a size of the opening and the electronic elements comprise at least one passive device;
locating the carrier flange in the opening, and fixing the carrier flange to the heat dissipating plate;
bonding wires between the electronic elements and the printed circuit board, to connect the electronic elements to the printed circuit board through bond-wires directly,
wherein a decoupling capacitor is disposed on the printed circuit board, and
the bonding wires between the electronic elements and the printed circuit board comprises:
bonding wires between the passive device and the decoupling capacitor to form a decouple circuit.

12. The assembly method according to claim 11, wherein the electronic elements further comprise a die, the passive device is a capacitor, the die and the capacitor are directly welded on the carrier flange, the carrier flange is welded on the heat dissipating plate and the die and the capacitor are directly connected to the printed circuit board through the bond-wires.

13. The assembly method according to claim 12, wherein the passive device is an L-shaped passive device, and the L-shaped passive device has a long side and a short side.

14. The assembly method according to claim 13, wherein the bonding wires between the passive device and the decoupling capacitor comprises:
bonding the wires between the decoupling capacitor and the short side of the L-shaped passive device via the bond-wires.

15. The assembly method according to claim 12, wherein the passive device is a rectangular passive device, and
the bonding wires between the passive device and the decoupling capacitor comprises:
bonding the wires between the decoupling capacitor and the short side of the rectangular passive device via the bond-wires.

16. The assembly method according to claim 11, wherein a resistor is disposed on the printed circuit board, and
the bonding wires between the passive device and the decoupling capacitor comprises:
bonding the wires between the passive device and the decoupling capacitor via the resistor.

17. The assembly method according to claim 11, wherein top surfaces of the electronic elements of the power device are flush with a top surface of the printed circuit board.

18. The assembly method according to claim 11, wherein a protective cover is disposed outside the power device, the bond-wires and the decoupling LC circuit, the protective cover is fixed on the printed circuit board and completely covers the power device, the bond-wires and the decoupling LC circuit to form a closed cavity, and a sealant is applied on an edge, connected with the printed circuit board, of the protective cover.

\* \* \* \* \*